(12) United States Patent
Benzel

(10) Patent No.: US 7,563,634 B2
(45) Date of Patent: Jul. 21, 2009

(54) METHOD FOR MOUNTING SEMICONDUCTOR CHIPS, AND CORRESPONDING SEMICONDUCTOR CHIP SYSTEM

(75) Inventor: Hubert Benzel, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 114 days.

(21) Appl. No.: 11/666,179

(22) PCT Filed: Aug. 24, 2005

(86) PCT No.: PCT/EP2005/054165

§ 371 (c)(1),
(2), (4) Date: Sep. 4, 2007

(87) PCT Pub. No.: WO2006/045653

PCT Pub. Date: May 4, 2006

(65) Prior Publication Data

US 2008/0128840 A1 Jun. 5, 2008

(30) Foreign Application Priority Data

Oct. 22, 2004 (DE) .................. 10 2004 051 468

(51) Int. Cl.
*H01L 21/00* (2006.01)
(52) U.S. Cl. .................. 438/53; 257/419; 257/E23.175
(58) Field of Classification Search ............... 257/419, 257/E23.175; 438/53, 48, 51
See application file for complete search history.

(56) References Cited

U.S. PATENT DOCUMENTS 5,721,446 A * 2/1998 Kobayashi .................. 257/419

(Continued)

FOREIGN PATENT DOCUMENTS

DE 19902450 8/2000

(Continued)

OTHER PUBLICATIONS

Kato S. et al., "High-precision silicon differential pressure sensor monolithically integrated with twin diaphragms and micro over-range protection structures," Jan. 23, 2000, pp. 347-351, Proceedings IEEE Thirteenth Annual International Conference on Micro electro Mechanical Systems.

*Primary Examiner*—David A Zarneke
*Assistant Examiner*—Jenny L Wagner
(74) *Attorney, Agent, or Firm*—Kenyon & Kenyon LLP

(57) ABSTRACT

A method is described for mounting semiconductor chips and a corresponding semiconductor chip system. The method may include providing a semiconductor chip having a surface that includes a diaphragm region and a peripheral region, the peripheral region having a mounting region, and a cavity being disposed underneath the diaphragm region, which extends into the mounting region and ends there in an opening. The method may also include providing a substrate which has a surface having a recess; mounting the mounting region of the semiconductor chip in flip-chip technology onto the surface of the substrate in such a way that an edge of the recess lies between the mounting region and the diaphragm region and the opening faces in the direction of the substrate. Additionally, the mounting region is underfilled using an underfilling, the edge of the recess serving as separating region for the underfilling so that no underfilling reaches the diaphragm region; and a through hole is provided through the substrate to the opening of the cavity.

19 Claims, 9 Drawing Sheets

U.S. PATENT DOCUMENTS 6,432,737 B1 * 8/2002 Webster ..................... 438/53
2005/0194685 A1 * 9/2005 Weiblen et al. ............ 257/738

FOREIGN PATENT DOCUMENTS

| | | |
|---|---|---|
| DE | 10032579 | 1/2002 |
| DE | 10347215 | 5/2005 |
| DE | 102004011203 | 9/2005 |
| EP | 0811831 | 12/1997 |
| EP | 1278053 | 1/2003 |

* cited by examiner

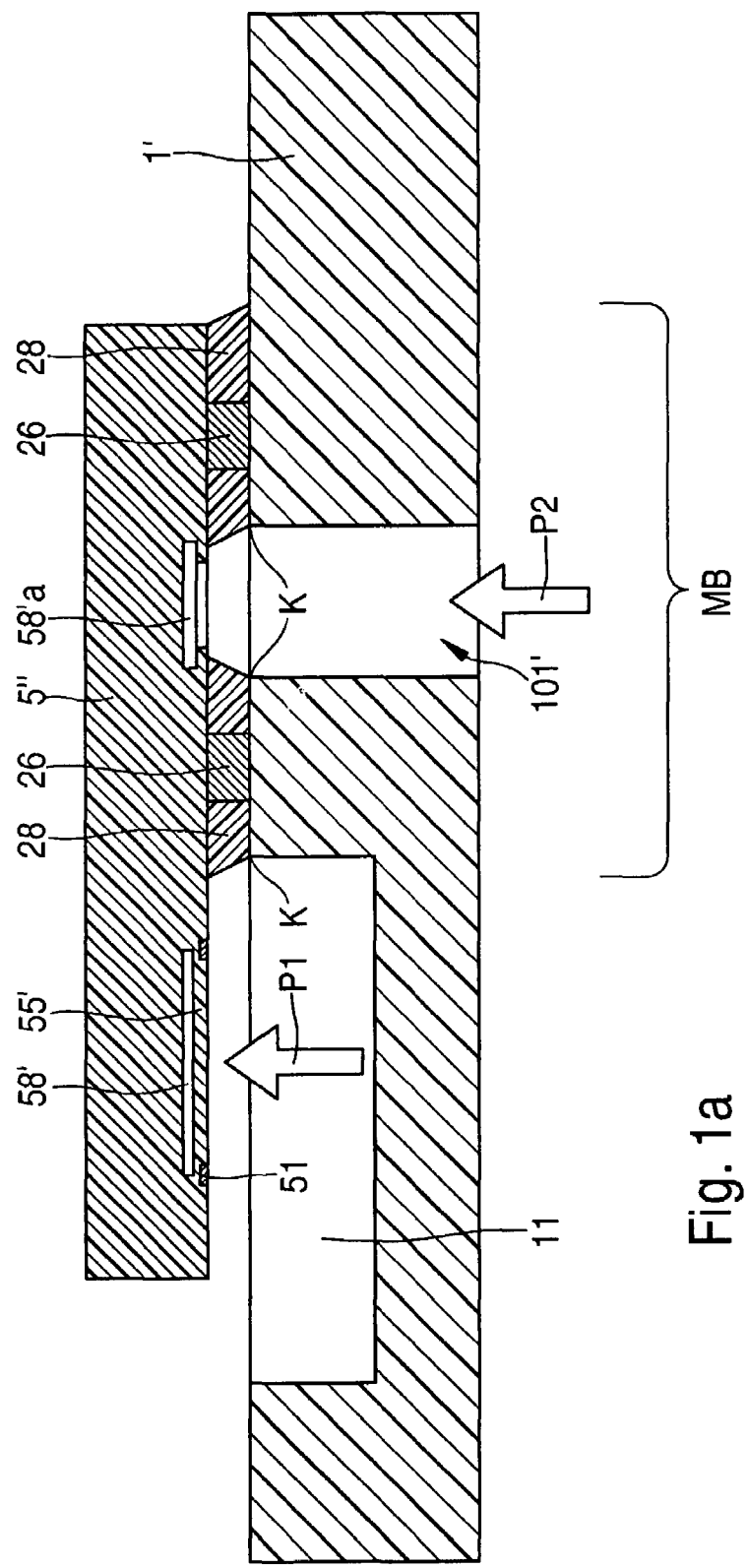

METHOD FOR MOUNTING SEMICONDUCTOR CHIPS, AND CORRESPONDING SEMICONDUCTOR CHIP SYSTEM

FIELD OF THE INVENTION

The present invention relates to a method for mounting semiconductor chips and to a corresponding semiconductor chip system. Although applicable to any semiconductor chip system, the present invention as well as the problem underlying it are explained with respect to a micromechanical semiconductor chip system having a pressure sensor.

BACKGROUND INFORMATION

German Patent Application No. DE 102 004 011 203 describes various examples of methods for mounting semiconductor chips and corresponding semiconductor chip systems of which three examples will be discussed in greater detail in the following text.

FIG. 7 shows a first example for a method of mounting semiconductor chips and a corresponding semiconductor chip system in a cross-sectional view.

In FIG. 7, reference numeral 100 denotes a TO8 base produced from Kovar, for example. Reference numeral 5 is a micromechanical silicon pressure sensor chip having piezoresistive transducer elements 51, which are accommodated on a diaphragm 55. To produce diaphragm 55, a cavity 58 is introduced on the back of respective silicon pressure sensor chip 5, for instance by anisotropic etching, e.g., using KOH or TMAH. Alternatively, diaphragm 55 may also be produced by trench-etching.

Sensor chip 5 may be made up of a pure resistance bridge having piezoresistive resistors, or it may be combined with an evaluation circuit, which is integrated together with the piezoresistors in a semiconductor process. A glass base 140 made of sodium-containing glass, which is anodically bonded to the back of chip 5, is used to reduce mechanical stress caused by solder or adhesive 70 with whose aid glass base 140 is mounted on TO8 base 100. Reference numeral 53 in FIG. 7 denotes a bond pad of an integrated circuit 52 (not further shown), the bond pad being connected via a bonding wire 60 to an electrical connection device 130, which in turn is insulated from TO8 base 100 by an insulating layer 131. Glass base 140 has a through hole 141, which connects cavity 58 to externally prevailing pressure P, via a through hole 101 of TO8 base 100 and a connection device 120 affixed thereto. The configuration shown in FIG. 7 is usually also welded to a metal cap (not shown) so as to form a tight seal.

However, such a configuration has the disadvantage that it is cumbersome and that problems frequently arise with the hermetic enclosing of sensor chip 5, for instance because of leaky welding seams or the like. Since the TO8 housing and the silicon have different thermal coefficients of expansion, temperature changes cause mechanical stresses, which are measured as interference signals by piezoresistors.

FIG. 8 shows a second example for a method of mounting semiconductor chips and a corresponding semiconductor chip system in a cross-sectional view.

In this second example sensor chip 5 is bonded above a glass base 140', which has no through hole, to a substrate 1 made of ceramic or plastic, and passivated using a gel 2 to protect it from environmental influences. Additionally provided above the chip system on substrate 1 is a protective cap 13, which has a through hole 15 for pressure P to be applied. Glass base 140' also has no through hole in this example, since pressure P is applied from the other side.

When such a gel 2 is used, the maximum pressure is disadvantageously determined by gel 2, since gas diffuses into gel 2 and, if there is a sudden reduction in pressure, gas bubbles are created in gel 2, which destroy gel 2.

FIG. 9 shows a third example for a method of mounting semiconductor chips, and a corresponding semiconductor chip system in a cross-sectional view.

In this example, sensor chip 5' is a surface-micromechanical sensor chip, which was produced according to the method described in German Patent Application No. DE 100 32 579 A1, for example, and has an integrated cavity 58' above a diaphragm region 55'.

For mounting, bond pads 53 of sensor chip 5' are soldered onto bond pads (not shown) of the substrate in a mounting region, using a solder or bonding connection such as solder balls 26; the substrate is part of a premold housing 10 made of plastic from which a leadframe 8 formed therein projects on the side. Premold housing 10 has a recess 11, next to which sensor chip 5' is mounted in flip-chip technique so as to protrude.

The minimum clearance of the contact regions of leadframe 8 in the mounting region of sensor chip 5' is usually greater than the minimum clearance between bond pads 53 on sensor chip 5'. However, since only a few bond pads 53, such as four pieces for connecting a Wheatstone bridge, are required on sensor chip 5', they may be placed as far from one another as necessary.

In addition, the mounting region has underfilling 28 made of an insulating plastic material, and edge K of recess 11, which lies between the mounting region and diaphragm region 55, is used as separation edge for underfilling 28 during the mounting process. Separation edge K ensures that underfilling 28 is unable to get into or under diaphragm region 55'. Diaphragm region 55' of sensor chip 5' thereby laterally projects next to the strip-shaped mounting region, so that the pressure medium is able to reach diaphragm region 55' without hindrance.

In diaphragm region 55', the surface of sensor chip 5' is passivated by a layer (not shown), e.g., a nitride layer, which acts as a reliable medium protection. Underfilling 28 protects the mounting region of sensor chip 5' from corrosion.

Finally, premold housing 10 has an annular sidewall region 10a on whose upper side a cover 20' is provided, which has a through hole 15b for pressure P to be applied. Since sensor chip 5' is distanced from the upper side of premold housing 10 by the flip-chip mounting on the side of the peripheral region opposite the mounting region, an uncomplicated transmission of applied pressure P to diaphragm region 55 is ensured.

Furthermore, cover 20' has a pressure connection nipple 21, and an optional filter 22, which prevents particles or fluid media from gaining access to the interior of the sensor packaging, is able to be installed in through hole 15b. This may prevent the entry of water, for instance, which, when freezing, could forcibly dislodge and thereby destroy sensor chip 5'.

In this example, glass base 140, 140' according to FIGS. 7 and 8, respectively, whose production entails considerable expense, may be omitted completely since the lateral projection of surface-micromechanical sensor chip 5' next to the strip-shaped mounting region already allows the dissipation of the stresses that are produced by different temperature expansion coefficients of silicon and the connection via solder balls 26 and underfilling 28.

SUMMARY

In accordance with example embodiments of the present invention, an overhanging type of configuration of a semiconductor chip is provided, in particular a surface-micromechanical (CMM) differential-pressure chip, on a substrate having a recess, using a flip-chip mounting technique, in which a mechanical decoupling of the semiconductor chip is provided by the lateral overhang.

An example method according to the present invention for mounting semiconductor chips and a corresponding semiconductor chip system may have the advantage over conventional approaches that they allow a simple and cost-effective configuration, which is not susceptible to stressing.

An example embodiment of the present invention may also have the advantage that, compared to an absolute-pressure sensor without a second pressure connection, no further process steps are required apart from an additional, brief silicon trenching step to open an access opening to a cavity, thereby making the example method according to the present invention very cost-effective. The etching step for opening the second pressure access need not be implemented through the entire sensor, but only through a slight thickness of the diaphragm, which requires a short etching process.

Potential clogging of the connection channel from diaphragm cavity to pressure connection hole by particles in the medium may be prevented by a large-area, fine-grid mesh. The sensor type according to an example embodiment of the present invention has a very medium-resistant configuration, which protects the electrical connections made of aluminum, for example, by the underfilling. The pressure medium can reach only surfaces made of silicon or silicon nitride (passivation). No gel for passivating the electrical chip connections (bond pads) is required.

A monocrystalline silicon diaphragm is able to be produced whose special advantage is the high mechanical strength and the high K factor of the piezoresistors doped therein.

Solder connecting on the semiconductor chip and the substrate brings about alignment of the semiconductor chip due to the surface tension of the solder. The energetically most advantageous state may be attained when the solder between two contact surfaces on chip and substrate has the smallest surface. This may be achieved when both areas are positioned directly on top of one another. With the aid of this self-adjustment the pressure access hole is precisely adjusted on the chip connection. This may allow a precise alignment even of very small structures.

Existing production processes such as the semiconductor process for the sensor components and/or evaluation circuit components or for sensor housing components, may continue to be used to a large extent.

Electrical preliminary measuring in the wafer composite is possible, as is an adjustment at the end of production line after mounting on the carrier. The example method according to the present invention may also allow a space-saving configuration of sensor chip and evaluation circuit.

Advantageous embodiments of the present invention, as well as improvements thereto, are described in detail below.

According to one preferred further development, a plurality of bond pads is provided in the mounting region, the bond pads being mounted on the substrate surface via a soldering or adhesive connection.

According to another preferred further development, the through hole through the substrate to open the cavity is implemented prior to mounting the semiconductor chip.

According to another preferred further development, a first pressure connection device is provided on the rear of the substrate, and a second pressure connection device on the front of the substrate, which are configured in such a way that different pressures are able to be applied to the two sides of the diaphragm area.

According to one further preferred development, the substrate is part of a prefabricated housing.

According to yet another preferred refinement, the housing is a premold housing made of plastic, into which a leadframe is molded.

According to one additional further development, the housing has an annular sidewall region, which surrounds the sensor chip and is sealed above the sensor chip by a cover having a through hole.

According to another preferred further development, the cavity has a first cavity region, a second cavity region, and a third cavity region, the first cavity region lying underneath the diaphragm area, the third cavity region lying in the peripheral region and having the opening to the substrate, and the second cavity region being a channel-like region that connects the first and third channel regions.

According to another preferred further development, the second cavity region has a narrow longitudinal form.

According to another preferred further development, the first cavity region has a rectangular, preferably square form.

According to another preferred further development, the second cavity region starts in a corner of the first cavity region.

According to another preferred further development, a piezoelectric or piezoresistive pressure recording device is provided in the diaphragm region.

BRIEF DESCRIPTION OF THE DRAWINGS

Exemplary embodiments of the present invention are depicted in the figures and described in greater detail below.

They show.

DETAILED DESCRIPTION OF EXAMPLE EMBODIMENTS

Figure 1B:
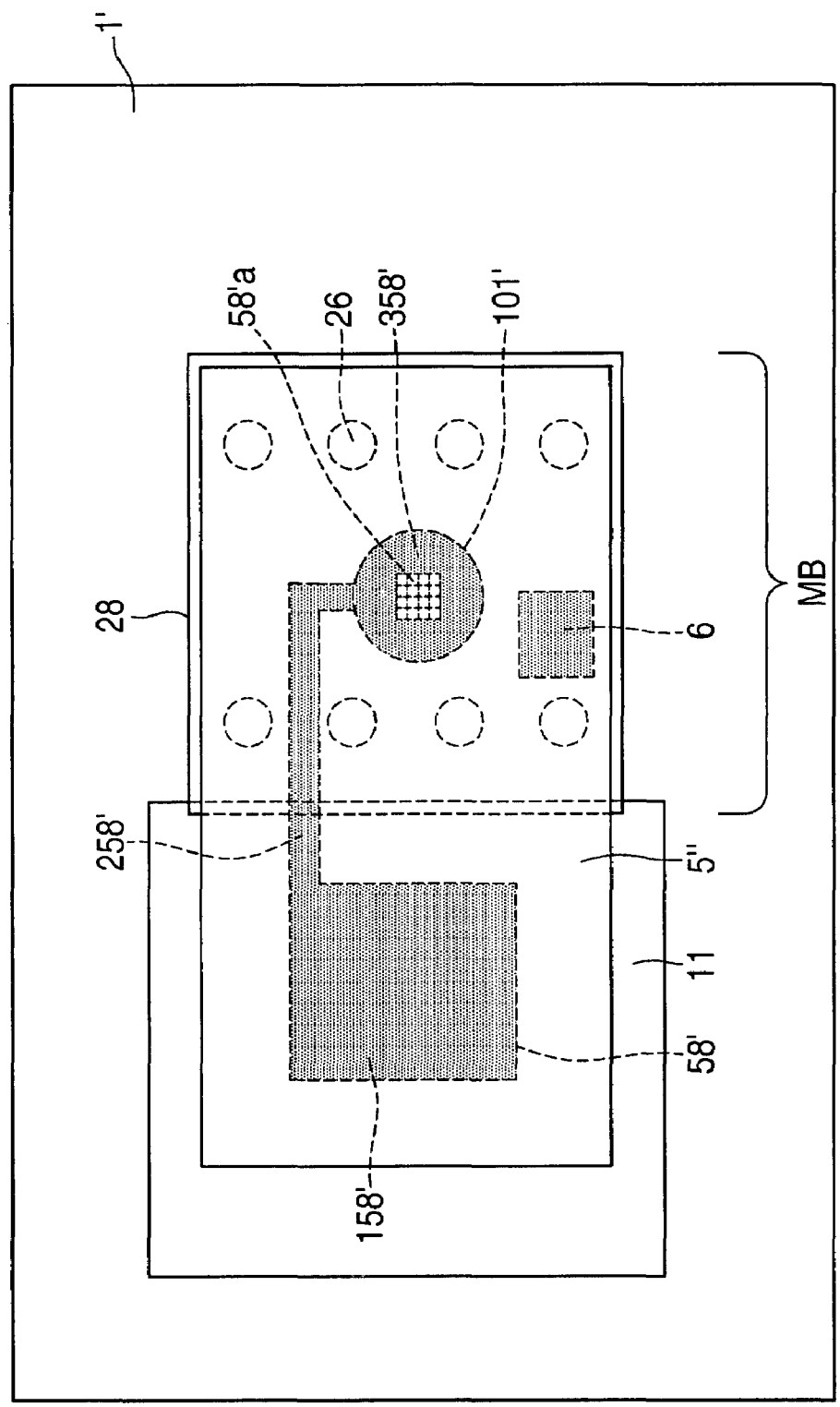
FIGS. 1*a,b* show a first specific example embodiment of the method according to the present invention for mounting semiconductor chips, and a corresponding semiconductor chip system, in a side view and a plane cross-sectional view.

In the figures, like reference numerals designate like or functionally equivalent components.

FIGS. 1a,b show a first specific example embodiment of the method according to the present invention for mounting semiconductor chips and a corresponding semiconductor chip system in a side view and a plane cross-sectional view.

In this example, sensor chip 5" is a surface-micromechanical sensor chip, which was produced according to the method described in German Patent Application No. DE 100 32 579 A1, for example, and which has an integrated cavity 58' above a diaphragm region 55'.

For mounting, bond pads of sensor chip 5" are soldered to bond pads (not shown) of substrate 1' in a mounting region MB using a solder or bonding connection, such as solder balls 26, the substrate in this case being a printed circuit board or ceramic and having a recess 11 next to which sensor chip 5" is mounted in flip-chip technology, so as to overhang.

In addition, mounting region MB has an underfilling 28 made of an insulating plastic material; edge K of recess 11, which lies between the mounting region and diaphragm region 55', is used as separation edge for underfilling 28 during the mounting process. Separation edge K ensures that underfilling 28 is unable to get into or under diaphragm region 55'. Diaphragm region 55' of sensor chip 5" thereby laterally projects next to the strip-shaped mounting region, so that the pressure medium having pressure P1 is able to reach diaphragm region 55' without hindrance.

In diaphragm region 55', sensor chip 5" is passivated on the surface by a layer (not shown), e.g., a nitride layer, which acts as reliable medium protection. In the mounting region, sensor chip 5" is protected from corrosion by underfilling 28.

In contrast to the configuration shown above in connection with FIG. 9, sensor chip 5" has a different structure of cavity 58', which is shown in FIG. 1b. In particular, cavity 58' has a first cavity region 158', a second cavity region 258', and a cavity region 358'. First cavity region 158' lies below diaphragm region 55', as in FIG. 9. Additional third cavity region 358' lies in the peripheral region, i.e., in this case in the middle of mounting region MB, and includes an opening 58'a, which makes cavity 58' accessible toward the outside for an application of pressure. Furthermore, second cavity region 258' in this specific embodiment is a channel-like region connecting first and third cavity regions 158', 358'.

In this specific example embodiment, first cavity region 158' has a square form, and second cavity region 258' starts out from one corner of first cavity region 158'. This is advantageous for preventing possible stress-induced voltages of second cavity region 258' into piezo-resistors 51.

Third cavity region 358' is round in the present example and has a mesh-like opening 58'a, as can be seen in FIG. 1b, the mesh structure being required to prevent foreign particles from penetrating cavity 58', or to prevent clogging of the channel region.

Substrate 1' has a through hole 101' below opening 58'a, which allows the incoupling of pressure P2 through substrate 1' into cavity 58'. The region of through hole 101' is also not reached by underfilling 28 in the flip-chip mounting already discussed in connection with FIG. 9. This once again results in an edge on substrate 1' at which a meniscus forms and stops underfilling 28.

According to FIG. 1b, evaluation circuit 6 is integrated in mounting region MB of chip 5". Of course, an approach that uses a separate evaluation chip is conceivable as well.

Due to the above-described configuration of this specific embodiment, it is possible to apply a first pressure P1 to one side of diaphragm region 55' through recess 11, and to apply a second pressure P2 at the other side of diaphragm region 55' through hole 101'. The shown specific example embodiment is therefore particularly suitable for a differential-pressure sensor device.

Below, two specific embodiments are described from which it can be gathered how the different pressures P1, P2 are expediently able to be applied to the two sides of diaphragm region 55' independently of one another.

Figure 2:
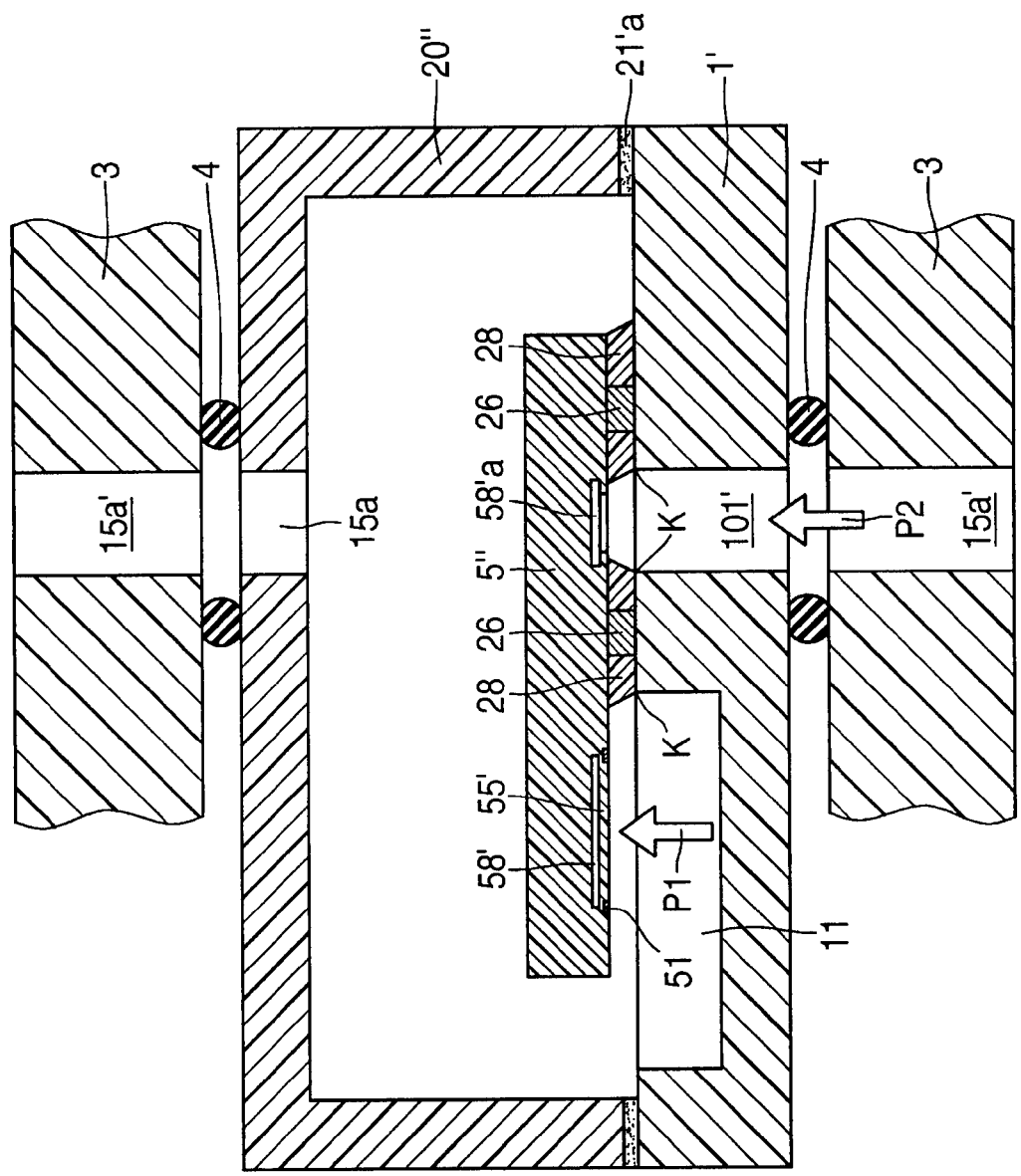
FIG. 2 shows a second specific example embodiment of the method according to the present invention for mounting semiconductor chips, and a corresponding semiconductor chip system, in a cross-sectional view.

FIG. 2 shows a second specific example embodiment of the method according to the present invention for mounting semiconductor chips and a corresponding semiconductor chip system in a cross-sectional view.

In the specific example embodiment according to FIG. 2, a cover 20" is provided on substrate 1' using a bonding agent 21'a. Cover 20" has an opening 15a.

In this case the pressure connection device has a housing device 3, which is flange-mounted to opening 15a and opening 101' with the aid of an O-ring device 4 and has corresponding pressure openings 15a'. Pressure P1 thus reaches only the front of diaphragm region 55', and pressure P2 reaches the rear of diaphragm region 55'.

Figure 3:
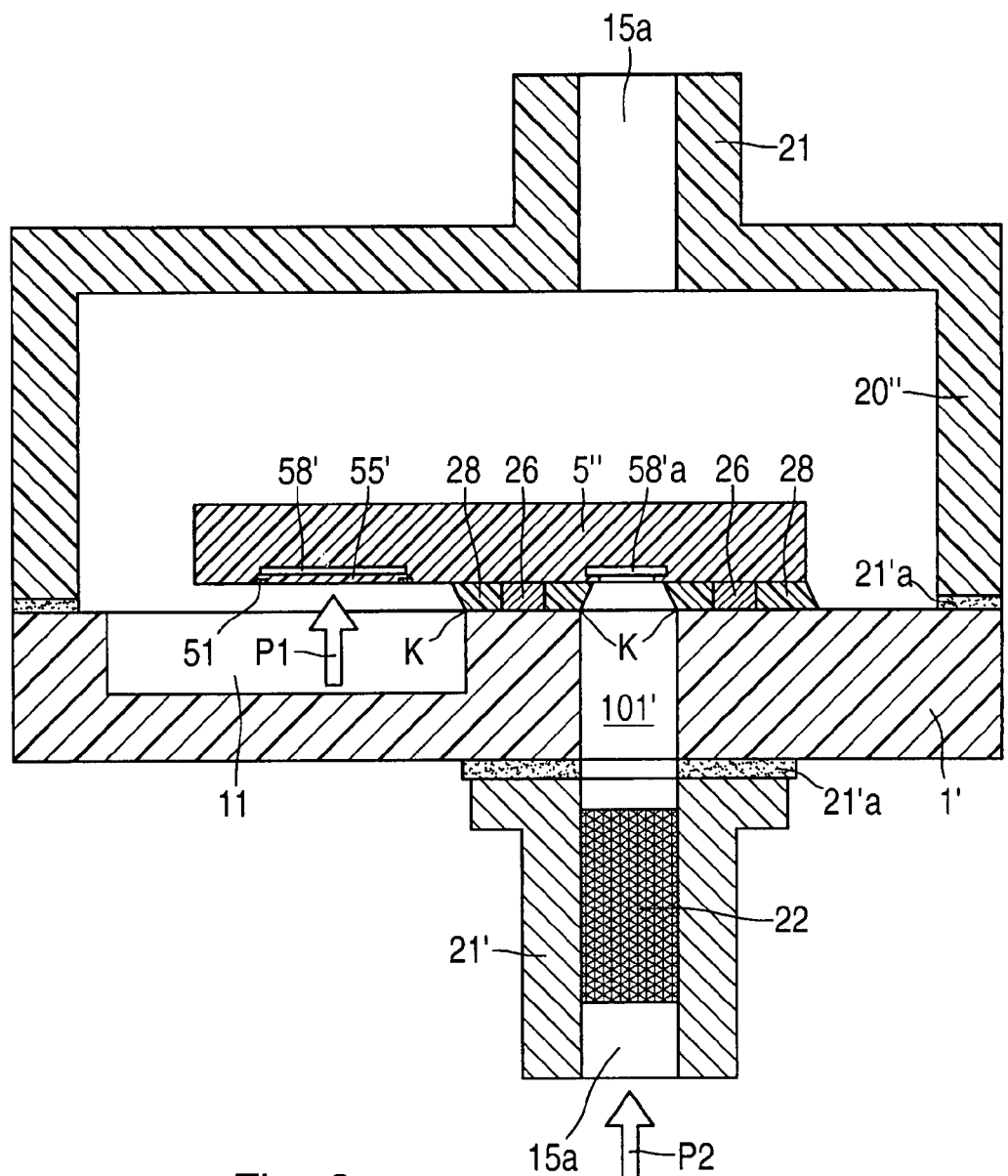
FIG. 3 shows a third specific embodiment of the method according to the present invention for mounting semiconductor chips, and a corresponding semiconductor chip system, in a cross-sectional view.

FIG. 3 shows a third specific example embodiment of the method according to the present invention for mounting semiconductor chips and a corresponding semiconductor chip system in a cross-sectional view.

In the specific example embodiment shown in FIG. 3, cover 20" is provided as well, but in this case it has a pressure connection nipple 21 having an opening 15a. On the rear of this specific embodiment, there is another pressure connection nipple 21', which is bonded to the rear of substrate 1' via a bonding layer 21'a. An optional filter 22 is additionally provided in pressure connection nipple 21'.

Figure 4:
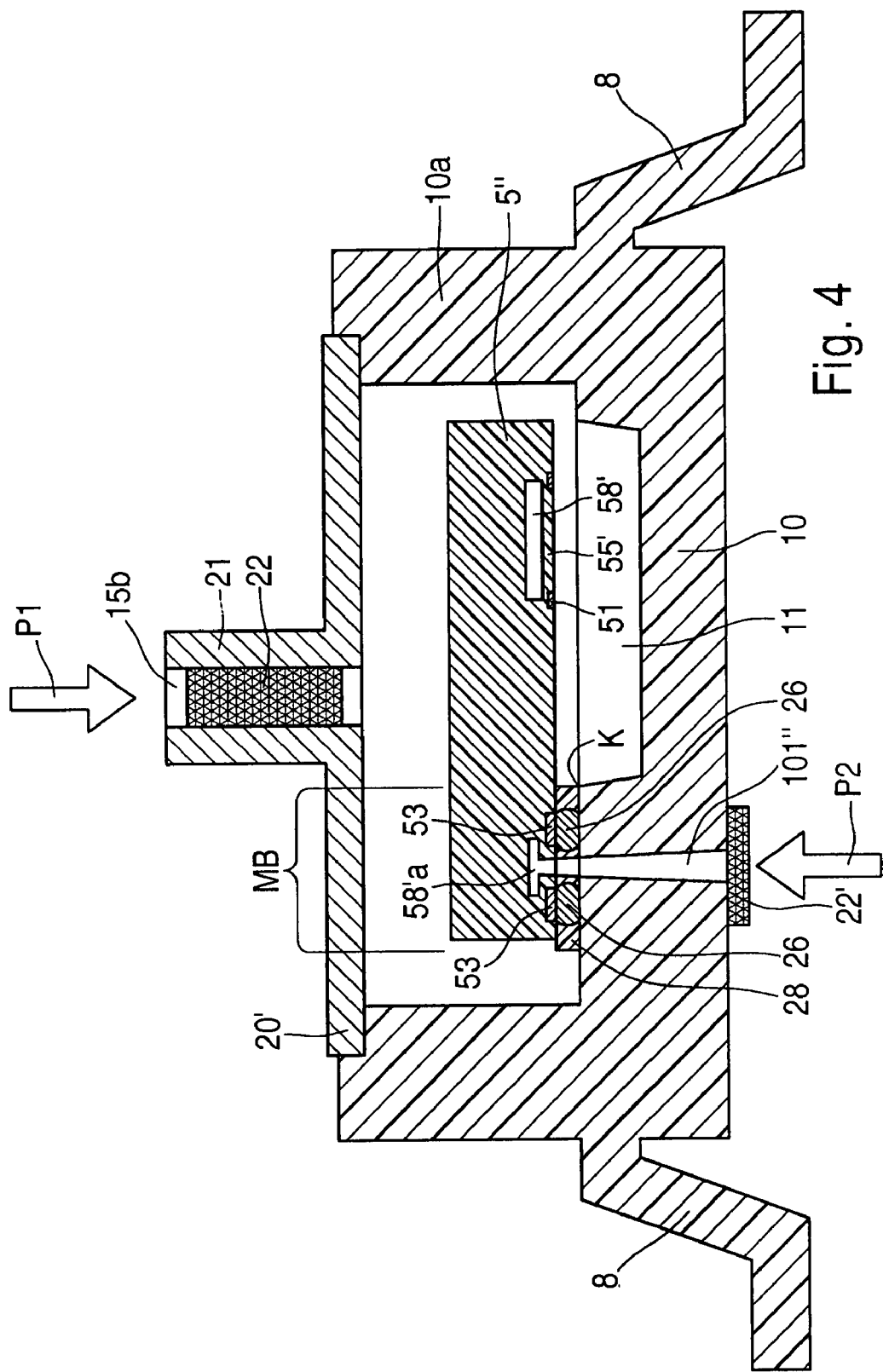
FIG. 4 shows a fourth specific example embodiment of the method according to the present invention for mounting semiconductor chips, and a corresponding semiconductor chip system, in a cross-sectional view.

FIG. 4 shows a fourth specific example embodiment of the method according to the present invention for mounting semiconductor chips and a corresponding semiconductor chip system in a cross-sectional view.

Figure 9:
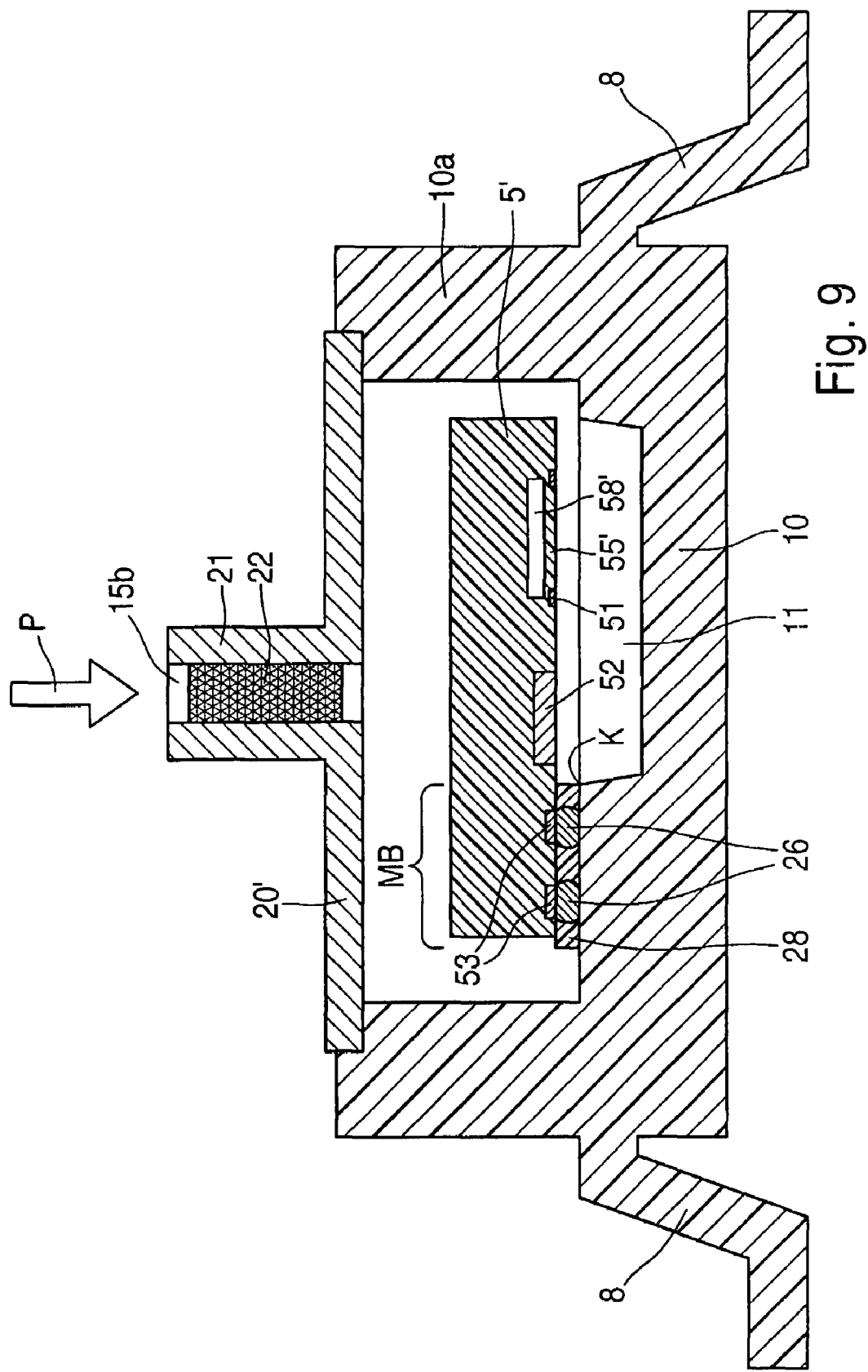
FIG. 9 shows a third example for a method of mounting semiconductor chips, and a corresponding semiconductor chip system, in a cross-sectional view.

The specific example embodiment shown in FIG. 4 is based on the example described in connection with FIG. 9.

However, here as well, sensor chip 5" has modified cavity 58', which was already discussed in depth in connection with FIG. 1b.

Premold housing 10 has on its rear a through hole 101" on which an optional filter 22' is bonded from the outside. Pressure P2 is able to reach the rear side of diaphragm region 55 through through hole 101".

As already described in connection with FIG. 9, pressure P1 is able to reach the front of diaphragm region 55' through connection nipple 21 and optional filter 22 disposed therein.

Figure 5:
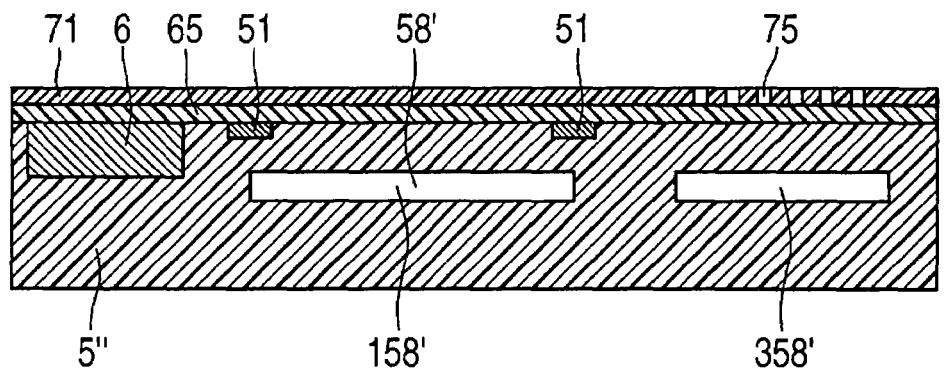
FIG. 5, 6 show a specific example embodiment of the semiconductor chip according to the present invention in the form of a pressure sensor, in a cross-sectional view.

FIG. 5, 6 show a specific example embodiment of the absolute or differential-pressure sensor according to the present invention in a cross-sectional view.

Figure 6:
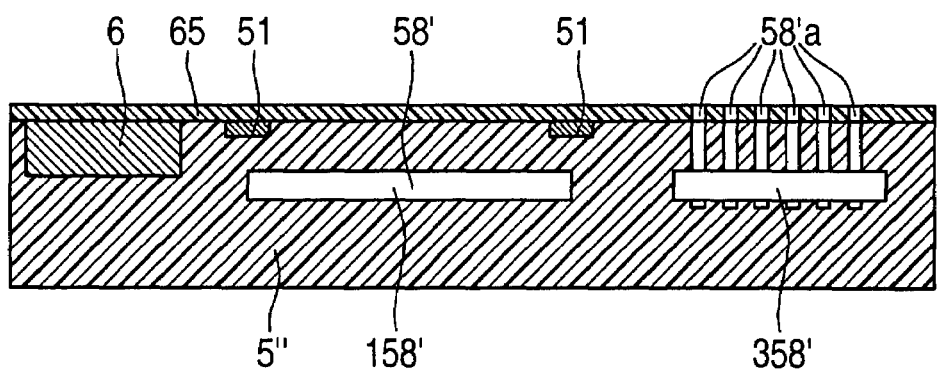
Figure 7:
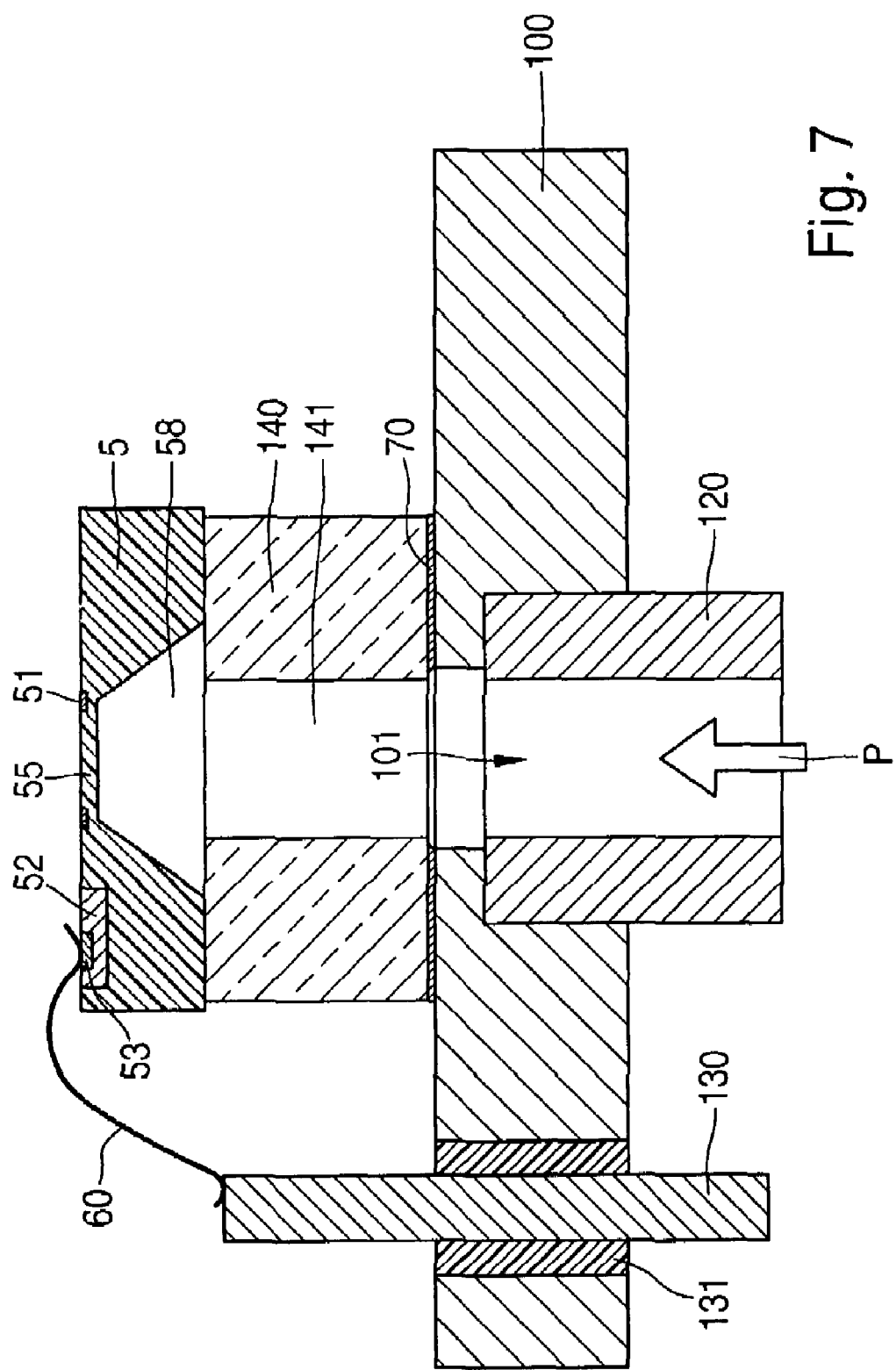
FIG. 7 shows a first example for a method of mounting semiconductor chips, and a corresponding semiconductor chip system, in a cross-sectional view.
Figure 8:
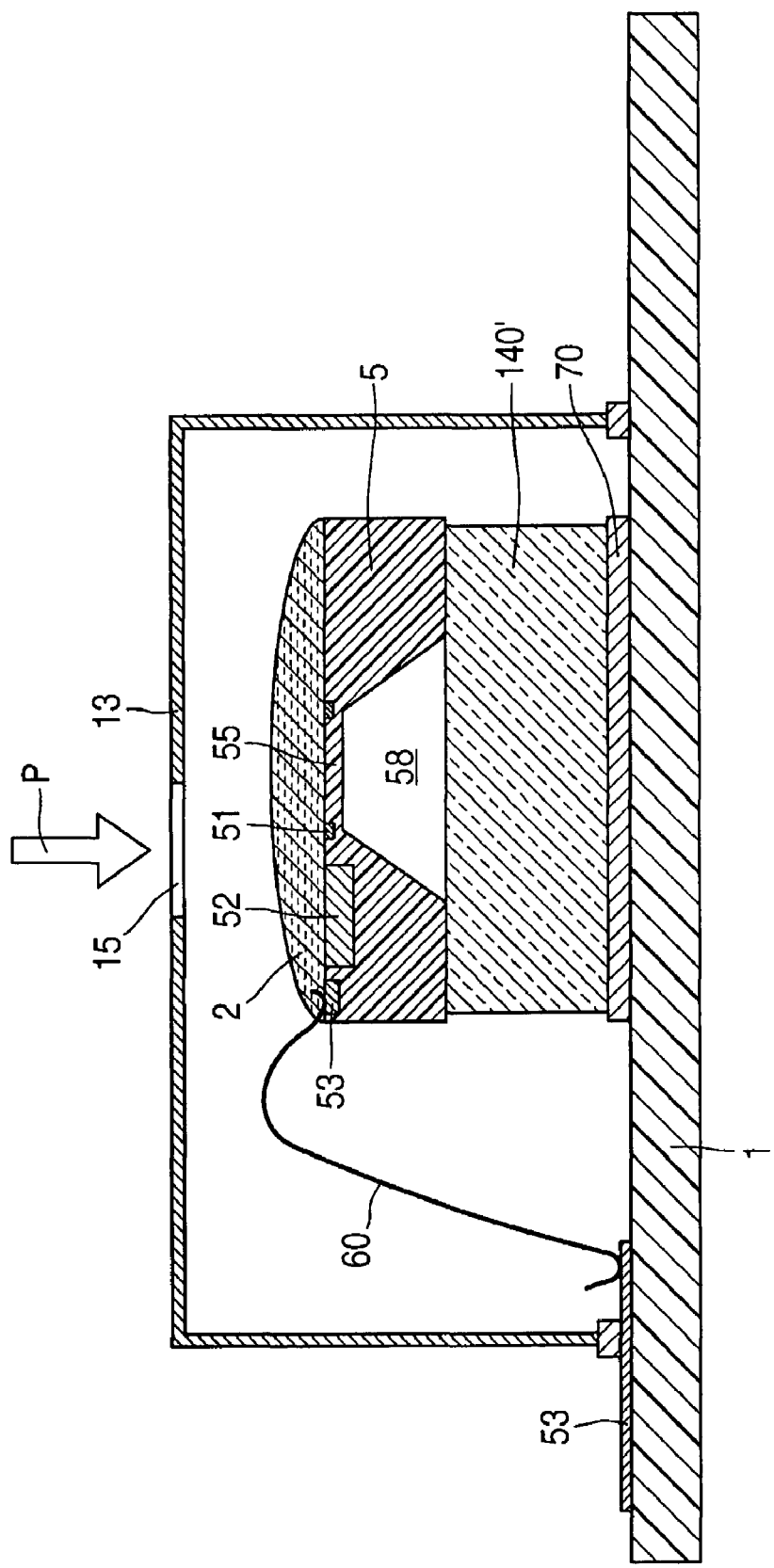
FIG. 8 shows a second example for a method of mounting semiconductor chips, and a corresponding semiconductor chip system, in a cross-sectional view.

FIGS. 5 and 6 describe the production of the mesh-like opening 58'a (cf. FIG. 1b) prior to the flip-chip mounting of sensor chip 5".

As shown in FIG. 5, first a passivation layer 65 made of silicon nitride, for instance, is applied on the front side of chip 5", and a photoresist layer 71 on top of it, which is patterned in the form of a mesh 7 in the appropriate region in the conventional manner, with the aid of a photolithographic process.

Using this patterned photoresist layer 71 as mask, etching may then be carried out to implement the mesh-like opening 58'a. A great advantage of this trench etching process is that only the thickness of passivation layer 65 and the cover layer made of silicon above cavity region 358' must be etched and not the entire thickness of silicon chip 5", as in the related art. Since this etching process does not stop when reaching third cavity region 358', the silicon situated underneath is attacked by etching, as can be gathered clearly from FIG. 6. Due to this basically non-interfering effect, an etching time of sufficient length may be set, so that it is ensured that corresponding openings 58'a to cavities 58 are reliably opened up across the entire wafer.

Although the present invention has been explained above with reference to preferred specific example embodiments, it is not restricted to them, but may be implemented in other ways as well.

Only piezoresistive sensor structures were considered in the above examples. However, the present invention is also suitable for capacitive or other sensor structures in which diaphragms are used.

The geometry of the diaphragm may be configured as desired, but preferably has a square, rectangular or round design.

What is claimed is:

1. A method for mounting a semiconductor chip, comprising:
    providing a semiconductor chip having a surface that includes a diaphragm region and a peripheral region, the peripheral region having a mounting region, and a cavity being disposed underneath the diaphragm region, which extends into the mounting region and ends there in an opening;
    providing a substrate which has a surface having a recess;
    mounting the mounting region of the semiconductor chip in flip-chip technology onto the surface of the substrate in such a way that an edge of the recess lies between the mounting region and the diaphragm region, and the opening faces in a direction of the substrate;
    underfilling the mounting region using an underfilling, the edge of the recess serving as separating region for the underfilling so that no underfilling reaches the diaphragm region; and
    providing a through hole through the substrate to the opening of the cavity.

2. The method as recited in claim 1, wherein a plurality of bond pads is provided in the mounting region, the bond pads being mounted on the surface of the substrate via one of a solder connection or a bonding connection.

3. The method as recited in claim 1, wherein the through hole through the substrate to the opening of the cavity is implemented prior to mounting the semiconductor chip.

4. The method as recited in claim 1, wherein a first pressure connection device is provided on a rear of the substrate, and a second pressure connection device is provided on a front of the substrate, which are designed such that different pressures are able to be applied to the rear and front of the diaphragm region, respectively.

5. The method as recited in claim 1, wherein the substrate is part of a premanufactured housing.

6. The method as recited in claim 5, wherein the housing is a premold housing made of plastic into which a leadframe is molded.

7. The method as recited in claim 5, wherein the housing has an annular side wall region, which surrounds the sensor chip and which is sealed above the sensor chip by a cover having a through hole.

8. A semiconductor chip system, comprising:
    a semiconductor chip having a surface that includes a diaphragm region and a peripheral region, the peripheral region having a mounting region, and a cavity being disposed underneath the diaphragm region, which extends into the mounting region and ends there in an opening; and
    a substrate which has a surface having a recess;
    wherein:
    the mounting region of the semiconductor chip is mounted on the surface of the substrate in flip-chip technology in such a way that an edge of the recess lies between the mounting region and the diaphragm region and the opening faces in a direction of the substrate;
    the mounting region is underfilled by an underfilling, and the edge of the recess serves as a separating region for the underfilling, so that no underfilling is present in the diaphragm region; and
    a through hole is provided through the substrate to the opening of the cavity.

9. The semiconductor chip system as recited in claim 8, wherein a plurality of bond pads is provided in the mounting region, the bond pads being mounted on the surface of the substrate via a solder or a bonding connection.

10. The semiconductor chip system as recited in claim 8, further comprising:
    a first pressure connection device provided on a rear of the substrate; and
    a second pressure connection device is provided on a front of the substrate;
    wherein the first pressure connection device and the second pressure connection device are adapted such that different pressures are able to be applied to the front and rear of the diaphragm region.

11. The semiconductor chip system as recited in claim 8, wherein the substrate is part of a premanufactured housing.

12. The semiconductor chip system as recited in claim 11, wherein the housing is a premold housing made of plastic, into which a leadframe is molded.

13. The semiconductor chip system as recited in claim 11, wherein the housing has an annular side wall region which surrounds the sensor chip and is sealed above the sensor chip by a cover having a through hole.

14. The semiconductor chip system as recited in claim 8, wherein the cavity has a first cavity region, a second cavity region, and a third cavity region, the first cavity region lies underneath the diaphragm region, the third cavity region lies in the peripheral region and has the opening to the substrate, and the second cavity region is a channel-like region, which connects the first and third cavity regions.

15. The semiconductor chip system as recited in claim 14, wherein the second cavity region has a narrow longitudinal form.

16. The semiconductor chip system as recited in claim 15, wherein the first cavity region has a rectangular form.

17. The semiconductor chip system as recited in claim 16, wherein the first cavity region has a square form.

18. The semiconductor chip system as recited in claim 16, wherein the second cavity region starts from a corner of the first cavity region.

19. The semiconductor chip system as recited in claim 8, wherein a piezoelectric or piezoresistive pressure recording device is provided in the diaphragm region.

* * * * *